US011194250B2

(12) United States Patent
Wang et al.

(10) Patent No.: US 11,194,250 B2
(45) Date of Patent: Dec. 7, 2021

(54) METAL OXIDE PHOTOSENSITIVE RESIN COMPOSITION, AND COLOR FILTER AND IMAGE DISPLAY DEVICE MANUFACTURED USING SAME

(71) Applicant: DONGWOO FINE-CHEM CO., LTD., Iksan-si (KR)

(72) Inventors: Hyun Jung Wang, Seoul (KR); Ju Ho Kim, Pyeongtaek-si (KR); Hyung Joo Kim, Pyeongtaek-si (KR); Sung Hun Hong, Pyeongtaek-si (KR)

(73) Assignee: Dongwoo Fine-Chem Co., Ltd., Iksan-si (KR)

( * ) Notice: Subject to any disclaimer, the term of this patent is extended or adjusted under 35 U.S.C. 154(b) by 5 days.

(21) Appl. No.: 16/345,469

(22) PCT Filed: Aug. 24, 2017

(86) PCT No.: PCT/KR2017/009294
§ 371 (c)(1),
(2) Date: Apr. 26, 2019

(87) PCT Pub. No.: WO2018/080001
PCT Pub. Date: May 3, 2018

(65) Prior Publication Data
US 2019/0278174 A1 Sep. 12, 2019

(30) Foreign Application Priority Data
Oct. 26, 2016 (KR) .................. 10-2016-0140071
Jul. 3, 2017 (KR) .................. 10-2017-0084121

(51) Int. Cl.
*G03F 7/00* (2006.01)
*G02B 5/20* (2006.01)
*F21V 9/30* (2018.01)
*G03F 7/031* (2006.01)
*G03F 7/105* (2006.01)
*G03F 7/033* (2006.01)
*G03F 7/004* (2006.01)

(52) U.S. Cl.
CPC .............. *G03F 7/0007* (2013.01); *F21V 9/30* (2018.02); *G02B 5/20* (2013.01); *G03F 7/0043* (2013.01); *G03F 7/031* (2013.01); *G03F 7/033* (2013.01); *G03F 7/105* (2013.01)

(58) Field of Classification Search
CPC ........ F21V 9/30; G03F 7/0007; G03F 7/0043; G03F 7/031; G03F 7/033; G03F 7/105; G02B 5/20; G02B 5/206
See application file for complete search history.

(56) References Cited

U.S. PATENT DOCUMENTS

| | | | | |
|---|---|---|---|---|
| 10,872,931 | B2 * | 12/2020 | Kim | ................. H01L 51/5284 |
| 2011/0128466 | A1 * | 6/2011 | Ishii | ................. C09K 11/7789 |
| | | | | 349/61 |
| 2013/0331474 | A1 * | 12/2013 | Kida | ................. C08K 3/22 |
| | | | | 522/39 |
| 2016/0202548 | A1 * | 7/2016 | Lee | ................. B82Y 20/00 |
| | | | | 349/43 |
| 2017/0315389 | A1 * | 11/2017 | Chu | ................. G02F 1/133514 |
| 2018/0006093 | A1 * | 1/2018 | Kim | ................. H01L 33/06 |

FOREIGN PATENT DOCUMENTS

| | | | |
|---|---|---|---|
| CN | 102326101 | A | 1/2012 |
| JP | 2005-208336 | A | 8/2005 |
| JP | 2013-195697 | A | 9/2013 |
| JP | 2015-022029 | A | 2/2015 |
| JP | 2016-098375 | A | 5/2016 |
| JP | 2016-178056 | A | 10/2016 |
| KR | 10-2009-0019753 | | 2/2009 |
| KR | 10-2012-0113191 | | 10/2012 |
| KR | 10-2013-0000506 | | 1/2013 |
| KR | 20150106335 | A * | 9/2015 |
| KR | 10-2016-0060904 | | 5/2016 |
| KR | 20160113885 | A * | 10/2016 |
| KR | 20170003170 | A * | 1/2017 |
| WO | 2015/190594 | A1 | 12/2015 |
| WO | WO-2017175550 | A1 * | 10/2017 ............. C09D 17/00 |

OTHER PUBLICATIONS

Notification of Ground for Rejection from counterpart Korean Patent Appln. No. 10-2017-0084121 dated Jan. 2, 2019, and its English translation.
Notice of Reasons for Refusal from counterpart Japanese Patent Appln. No. 2019-521690 dated Jun. 9, 2020, and its English translation.
Office Action from counterpart Taiwanese Patent Application No. 106136551 dated Aug. 8, 2018, and its English translation.

* cited by examiner

*Primary Examiner* — Mariceli Santiago
(74) *Attorney, Agent, or Firm* — DLA Piper LLP (US)

(57) ABSTRACT

A metal oxide photosensitive resin composition for forming a blue pattern layer includes scattering particles including a metal oxide having an average particle diameter of 30 to 300 nm, provided that the metal oxide photosensitive resin composition does not include quantum dots.

14 Claims, No Drawings

METAL OXIDE PHOTOSENSITIVE RESIN COMPOSITION, AND COLOR FILTER AND IMAGE DISPLAY DEVICE MANUFACTURED USING SAME

TECHNICAL FIELD

The present invention relates to a metal oxide photosensitive resin composition including certain scattering particles, and a color filter and an image display device prepared using the same.

BACKGROUND OF THE INVENTION

A color filter is a thin-film-type optical element that may extract three colors of red, green and blue from white light to display the three colors in fine pixels. Here, one pixel has a size of approximately several tens to hundreds of micrometers. Such a color filter has a structure in which a black matrix layer, which is formed on a transparent substrate in a predetermined pattern to block out light through boundary regions between individual pixels, and a pixel unit, in which three primary colors including a plurality of colors (typically, red (R), green (G), and blue (B) colors) are aligned in a given order to form the individual pixels, are sequentially laminated.

As one of methods of realizing a color filter, a pigment dispersion method using a pigment-dispersed photosensitive resin has been used so far. However, the pigment dispersion method has a problem in that some of the light emitted from a light source is absorbed into the color filter while the light passes through the color filter, resulting in degraded optical efficiency. The method also has a problem in that color reproducibility may be degraded due to characteristics of a pigment included in the color filter.

In particular, it is required that the color filter has a high color reproduction range and excellent performance such as high brightness and a high contrast ratio as well as excellent pattern characteristics as the color filter is used in various fields including various image display devices. To solve the above problems, there has been proposed a method of preparing a color filter using a self-emission-type photosensitive resin composition including quantum dots.

Korean Unexamined Patent Publication No. 2013-0000506, which relates to a display device, discloses content related to the display device that includes a color conversion unit including a plurality of wavelength conversion particles configured to convert a wavelength of light; and a plurality of color filter particles configured to absorb light with a predetermined wavelength range from the light.

However, the color filter including the quantum dots has drawbacks in that performance of the color filter may be somewhat degraded due to a decline in efficiency of the quantum dots, particularly a decline in efficiency of blue quantum dots, and an increase in overall manufacturing costs may be caused because the blue quantum dots are very expensive.

Meanwhile, when blue pixels are formed using a conventional blue photosensitive resin composition in a color filter including red and green quantum dots, the color filter has excellent photoluminescence intensity and color purity as viewed from the front thereof, but has low blue photoluminescence intensity as viewed from the sides thereof. Therefore, the blue photosensitive resin composition has problems regarding degraded brightness and low color purity of the color filter.

Therefore, there is a demand for development of a photosensitive resin composition capable of preventing a decline in efficiency of the blue pixels and reducing manufacturing costs.

DETAILED DESCRIPTION

Technical Problem

Accordingly, it is an aspect of the present invention to provide a metal oxide photosensitive resin composition capable of preventing a decline in efficiency of blue pixels according to a viewing angle and reducing manufacturing costs.

It is another aspect of the present invention to provide a color filter including a blue pattern layer prepared using the aforementioned metal oxide photosensitive resin composition.

It is still another aspect of the present invention to provide an image display device including the aforementioned color filter; and a light source emitting blue light.

Solution to Problem

To solve the above problems, according to one aspect of the present invention, there is provided a metal oxide photosensitive resin composition for forming a blue pattern layer, which includes scattering particles including a metal oxide having an average particle diameter of 30 to 300 nm, provided that the metal oxide photosensitive resin composition does not include quantum dots.

According to another aspect of the present invention, there is provided a color filter which includes a blue pattern layer including a cured product of the aforementioned metal oxide photosensitive resin composition for forming a blue pattern layer.

According to still another aspect of the present invention, there is provided an image display device which includes the aforementioned color filter; and a light source emitting blue light.

Advantageous Effects of Invention

Because the metal oxide photosensitive resin composition for forming a blue pattern layer according to the present invention does not include quantum dots but includes certain scattering particles, the metal oxide photosensitive resin composition can be useful in reducing manufacturing costs and preparing a color filter having a high viewing angle.

Also, because each of the color filter and the image display device prepared using the metal oxide photosensitive resin composition for forming a blue pattern layer according to the present invention includes certain scattering particles and a light source emitting blue light instead of blue quantum dots, the color filter and the image display device can be useful in securing excellent color reproduction characteristics and high optical efficiency, thereby realizing high-quality images and reducing manufacturing costs as well.

MODE OF THE INVENTION

Hereinafter, the present invention will be described in further detail.

In the present invention, when it is assumed that one part is disposed "on" another part, it can be directly disposed on the other part or intervening parts may also be present therebetween.

In the present invention, when it is assumed that one element "comprises," "includes" and "has" one component, it specifies the presence of other components, but does not preclude the presence of the other components unless otherwise specifically stated herein.

Metal Oxide Photosensitive Resin Composition for Forming Blue Pattern Layer

One aspect of the present invention relates to a metal oxide photosensitive resin composition for forming a blue pattern layer, which includes scattering particles including a metal oxide having an average particle diameter of 30 to 300 nm, provided that the metal oxide photosensitive resin composition does not include quantum dots.

Specifically, because the metal oxide photosensitive resin composition for forming a blue pattern layer according to the present invention includes scattering particles including a metal oxide having an average particle diameter of 30 to 300 nm, it is possible to prepare a pattern layer that may interact with a light source emitting blue light to act as blue pixels even when the metal oxide photosensitive resin composition does not include blue quantum dots.

In addition to the scattering particles, the metal oxide photosensitive resin composition for forming a blue pattern layer according to the present invention may further include a photopolymerizable compound, a photopolymerization initiator, a binder resin, a solvent, or an additive, excluding the quantum dots, but the present invention is not limited thereto.

Scattering Particles

The metal oxide photosensitive resin composition for forming a blue pattern layer according to the present invention includes scattering particles including a metal oxide having an average particle diameter of 30 to 300 nm.

According to one exemplary embodiment of the present invention, the metal oxide may include one or more oxides selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In, and a combination thereof.

According to another exemplary embodiment of the present invention, the metal oxide may include one or more selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO, MgO, and a combination thereof. When necessary, materials whose surfaces are treated with a compound containing an unsaturated bond such as an acrylate may be used as the metal oxide.

The scattering particles have an average particle diameter and a total content defined in the composition to maximize photoluminescence intensity of the color filter.

In the present invention, the term "average particle diameter" refers to a number average particle diameter, and may, for example, be calculated from an image observed under a field emission scanning electron microscope (FE-SEM) or a transmission electron microscope (TEM). Specifically, the average particle diameter may be obtained as an arithmetic average value by extracting several samples from the image observed with the FE-SEM or TEM, and measuring diameters of these samples.

The metal oxide has an average particle diameter of 30 to 300 nm. In this case, a scattering effect of the metal oxide is enhanced. Therefore, it is desirable that a blue light source may act as blue pixels even when the photosensitive resin composition including the scattering particles does not include blue quantum dots.

When the average particle diameter of the metal oxide is less than this diameter range, a scattering effect may be somewhat reduced, which makes it somewhat difficult for the metal oxide to act as the blue pixels. On the other hand, when the average particle diameter of the metal oxide is greater than this diameter range, the scattering particles may be precipitated in the photosensitive resin composition for forming a blue pattern layer, which makes it somewhat difficult to obtain a surface of a pattern layer with uniform quality. Therefore, the metal oxide is preferably used after the average particle diameter of the metal oxide is properly adjusted in this diameter range.

According to still another exemplary embodiment of the present invention, the scattering particles may be typically included at a content of 0.1 to 50 parts by weight, preferably included at a content of 1 to 30 parts by weight, and more preferably included at a content of 2 to 20 parts by weight, based on a total of 100 parts by weight of the metal oxide photosensitive resin composition. When the scattering particles are included within this content range, the scattering particles have an advantage in that a color filter having excellent photoluminescence intensity at a viewing angle in a range of −60° to +60° with respect to the front viewing angle of 0° may be prepared.

When the scattering particles are included at an amount less than this content range, the color filter has excellent photoluminescence intensity at the front viewing angle, but it may be somewhat difficult for the color filter to secure desired photoluminescence intensity as viewed from the right and left sides of the color filter. On the other hand, when the scattering particles are included at an amount greater than this content range, an effect of enhancing the photoluminescence intensity may be poor due to a light shielding effect of the scattering particles, and stability of the metal oxide photosensitive resin composition may also be degraded. Therefore, it is desirable that the scattering particles are properly used within this content range.

According to yet another exemplary embodiment of the present invention, the metal oxide photosensitive resin composition for forming a blue pattern layer may further include one or more selected from the group consisting of a blue coloring agent, a binder resin, a photopolymerizable compound, a photopolymerization initiator, and a solvent.

Blue Coloring Agent

The blue photosensitive resin composition of the present invention may further include a blue coloring agent. When the blue photosensitive resin composition according to the present invention further includes the blue coloring agent, light of a light source reflected by the scattering particles may be prevented from being re-reflected by ambient light such as sunlight, thereby realizing a high-quality image.

Specifically, the blue coloring agent may include a blue pigment, and the blue pigment may particularly include compounds that are classified into pigments in the Color Index (C.I.; published by the Society of Dyers and Colourists), and more particularly include pigments with the following C.I. numbers, but the present invention is not particularly limited thereto.

According to another exemplary embodiment of the present invention, the blue coloring agent may include one or more blue pigments selected from the group consisting of C.I. Pigment Blue 15:3, 15:4, 15:6, 16, 21, 28, 60, 64, 76, and a combination thereof.

Among these, it is desirable for the blue coloring agent to include one or more selected from the group consisting of C.I. Pigment Blue 15:3, C.I. Pigment Blue 15:4, Pigment Blue 15:6, and C.I. Pigment Blue 16 in terms of effects of inhibiting the reflection of ambient light and achieving high color reproducibility.

According to still another exemplary embodiment of the present invention, the blue coloring agent may further include one or more selected from the group consisting of a dye and a purple pigment.

The purple pigment may, for example, include one or more selected from the group consisting of C.I. Pigment Violet 1, 14, 19, 23, 29, 32, 33, 36, 37, 38 and a combination thereof, but the present invention is not limited thereto. Among these, it is desirable to use C.I. Pigment Violet 23 in terms of realizing high color reproducibility through a low content of coloring materials.

The dye may include compounds classified into dyes in the Color Index (published by the Society of Dyers and Colourists), or known blue or purple dyes disclosed in the Dyeing Notes (Color Dyeing Co.).

For example, C.I. Solvent dyes may include:
1. C.I. Solvent Blue 5, 35, 36, 37, 44, 45, 59, 67, and 70; and
2. C.I. Solvent Violet 8, 9, 13, 14, 36, 37, 47, and 49.

Among these, the C.I. Solvent dyes preferably include one or more selected from the group consisting of C.I. Solvent Blue 35, 36, 44, 45 and 70; and C.I. Solvent Violet 13.

Also, C.I. Acid dyes may include:
1. C.I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, and 340;
2. C.I. Acid Violet 6B, 7, 9, 17, 19, and 66, and the like.
3. Among these, the C.I. Acid dyes preferably include one or more selected from the group consisting of C.I. Acid Blue 80 and 90; and C.I. Acid Violet 66.

In addition, C.I. Direct dyes may include:
1. C.I. Direct Blue 38, 44, 57, 70, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, and 293;
2. C.I. Direct Violet 47, 52, 54, 59, 60, 65, 66, 79, 80, 81, 82, 84, 89, 90, 93, 95, 96, 103, and 104, and the like.

Further, C.I. Mordant dyes may include:
1. C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, and 84;
2. C.I. Mordant Violets 1, 2, 4, 5, 7, 14, 22, 24, 30, 31, 32, 37, 40, 41, 44, 45, 47, 48, 53, and 58, and the like.

The dyes may be used alone or in combination of two or more.

According to yet another exemplary embodiment of the present invention, the blue coloring agent may be included at a content of 0.1 to 50 parts by weight, preferably 0.5 to 30 parts by weight, and more preferably 1 to 20 parts by weight, based on a total of 100 parts by weight of the metal oxide photosensitive resin composition for forming a blue pattern layer.

When the content of the blue coloring agent is less than this content range, it may be somewhat difficult to secure a desired effect of inhibiting the reflection of ambient light. On the other hand, when the content of the blue coloring agent is greater than this content range, an increase in photoluminescence intensity may be somewhat mitigated, resulting in degraded stability of viscosity of the composition. Therefore, the blue coloring agent is properly used in this content range.

Binder Resin

The metal oxide photosensitive resin composition for forming a blue pattern layer according to the present invention may include a binder resin.

The binder resin typically has reactivity and alkaline solubility by an action of light or heat, and thus may serve as a dispersion medium for scattering particles. The binder resin included in the metal oxide photosensitive resin composition according to the present invention serves as a binder resin for scattering particles. In this case, binder resins may be used without limitation as long as the binder resins can be dissolved in an alkaline developing solution used in a developing process for preparing a color filter.

The binder resin may, for example, include a carboxyl group-containing monomer, and a copolymer of the monomer with another monomer copolymerizable therewith, and the like.

The carboxyl group-containing monomer may, for example, include unsaturated carboxylic acids such as an unsaturated polyhydric carboxylic acid having one or more carboxyl group in one molecule, for example, an unsaturated monocarboxylic acid, an unsaturated dicarboxylic acid, an unsaturated tricarboxylic acid, and the like. Here, the unsaturated monocarboxylic acid may, for example, include acrylic acid, methacrylic acid, crotonic acid, α-chloroacrylic acid, cinnamic acid, and the like. The unsaturated dicarboxylic acid may, for example, include maleic acid, fumaric acid, itaconic acid, citraconic acid, mesaconic acid, and the like. The unsaturated polyhydric carboxylic acid may be an acid anhydride, and may specifically include a maleic anhydride, an itaconic anhydride, a citraconic anhydride, and the like. Also, the unsaturated polyhydric carboxylic acid may be a mono(2-methacryloyloxyalkyl) ester thereof, examples of which may, for example, include mono(2-acryloyloxyethyl) succinate, mono(2-methacryloyloxyethyl) succinate, mono (2-acryloyloxyethyl) phthalate, mono(2-methacryloyloxyethyl) phthalate, and the like. The unsaturated polyhydric carboxylic acid be a mono(meth)acrylate of a dicarboxy polymer at each of both termini thereof, examples of which may, for example, include ω-carboxy polycaprolactone monoacrylate, ω-carboxy polycaprolactone monomethacrylate, and the like.

Such carboxyl group-containing monomers may be used alone or in combination of two or more. The other monomer copolymerizable with the carboxyl group-containing monomer may, for example, include one or more selected from the group consisting of aromatic vinyl compounds such as styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, indene, and the like; unsaturated carboxylic acid esters such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethylene glycol acrylate, methoxydiethylene glycol methacrylate, methoxytriethylene glycol acrylate, methoxytriethylene glycol methacrylate, methoxypropylene glycol acrylate, methoxypropylene glycol methacrylate, methoxydipropylene glycol acrylate, methoxydipropylene glycol methacrylate, isobornyl acrylate, isobornyl methacrylate, dicyclopentadienyl acrylate, dicyclopentadietyl methacrylate, adamantyl (meth)acrylate, norbornyl (meth)acrylate, 2-hydroxy-3-phenoxypropyl acrylate, 2-hydroxy-3-phenoxypropyl methacrylate, glycerol monoacrylate, glycerol monomethacrylate, and the like; unsaturated carboxylic acid aminoalkyl esters such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate, 3-dimethylaminopropyl methacrylate, and the like; unsaturated carboxylic acid glycidyl esters such as glycidyl acrylate, glycidyl methacrylate, and the like; carboxylic acid vinyl esters such as vinyl acetate, vinyl propionate, vinyl butyrate, vinyl benzoate, and the like; unsaturated ethers such as vinyl methyl ether, vinyl ethyl ether, allyl glycidyl ether, and the like; vinyl cyanide compounds such as acrylonitrile, methacrylonitrile, α-chloroacrylonitrile, vinylidene cyanide, and the like; unsaturated amides such as acrylamide, methacrylamide, α-chloroacrylamide, N-2-hydroxyethyl acrylamide, N-2-hydroxyethyl methacrylamide, and the like; unsaturated imides such as maleimide, benzylmaleimide, N-phenylmaleimide, N-cyclohexylmaleimide, and the like; aliphatic conjugated dienes such as 1,3-butadiene, isoprene, chloroprene, and the like; and macromonomers having monoacryloyl or monomethacryloyl groups at the termini of a polymer molecular chain, such as polystyrene, polymethyl acrylate, polymethyl methacrylate, poly-n-butyl acrylate, poly-n-butyl methacrylate, polysiloxane, and the like.

Such monomers may be used alone or in combination of two or more. In particular, bulky monomers such as a monomer having a norbornyl backbone, a monomer having an adamantane backbone, a monomer having a rosin backbone, and the like are preferred as the other monomer copolymerizable with the carboxyl group-containing monomer because the bulky monomers tend to reduce a specific dielectric constant value.

Binder resins having an acid value in a range of 20 to 200 (mg KOH/g) are preferably used as the binder resin. When the acid value satisfies this range, solubility in a developing solution may be improved, and thus an unexposed region may be easily dissolved, and an increase in sensitivity may be caused. Therefore, it is desirable because a pattern of an exposed region remains during development to improve a film remaining ratio. Here, the term "acid value" refers to a value measured as an amount (mg) of potassium hydroxide required to neutralize 1 g of an acrylic polymer, and may be typically calculated by titrating potassium hydroxide with an aqueous potassium hydroxide solution.

Also, binder resins having a polystyrene-converted weight average molecular weight (hereinafter simply referred to as 'weight average molecular weight') of 3,000 to 200,000, preferably 5,000 to 100,000 measured by gel permeation chromatography (GPC; using tetrahydrofuran as an elution solvent) are preferred. When the molecular weight of the binder resin falls within this range, hardness of a blue pattern layer may be improved. Therefore, it is desirable that the binder resin may have a high film remaining ratio, an unexposed region may have superior solubility in a developing solution, and resolution may be improved.

A molecular weight distribution [Weight average molecular weight (Mw)/Number average molecular weight (Mn)] of the binder resin is preferably in a range of 1.5 to 6.0, and more preferably in a range of 1.8 to 4.0. When the molecular weight distribution falls within this range, the binder resin has a desirable advantage in that the binder resin has an excellent developing property.

The binder resin may be included at a content of 5 to 85 parts by weight, preferably 10 to 70 parts by weight, and more preferably 20 to 60 parts by weight, based on a total of 100 parts by weight of the solid content of the metal oxide photosensitive resin composition. In this case, it is desirable because the occurrence of a development residue on a substrate of a non-pixel region may be inhibited due to sufficient solubility in a developing solution, and a decrease in film thickness of a pixel region in an exposed region may be not easily caused during development, resulting in a reduced missing part of a non-pixel region. When the binder resin is included at an amount less than this content range, the binder resin may respond to the scattering particles at a somewhat insignificant level. On the other hand, when the binder resin is included at an amount greater than this content range, solubility in a developing solution may be relatively somewhat degraded, which makes it difficult to form a pattern.

Photopolymerizable Compound

The metal oxide photosensitive resin composition for forming a blue pattern layer according to the present invention may include a photopolymerizable compound.

The photopolymerizable compound is a compound that may be copolymerized by an action of light and a photopolymerization initiator to be described below, and may include a monofunctional monomer, a bifunctional monomer, other multifunctional monomers, and the like. Specific examples of the monofunctional monomer may include nonylphenylcarbitol acrylate, 2-hydroxy-3-phenoxypropyl acrylate, 2-ethylhexylcarbitol acrylate, 2-hydroxyethyl acrylate, N-vinylpyrrolidone, and the like.

Specific examples of the bifunctional monomer may include 1,6-hexanediol di(meth)acrylate, ethylene glycol di(meth)acrylate, neopentyl glycol di(meth)acrylate, triethylene glycol di(meth)acrylate, a bis(acryloyloxyethyl) ether of bisphenol A, 3-methylpentanediol di(meth)acrylate, and the like.

Specific examples of the other multifunctional monomers may include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, and the like. Among these, bifunctional or higher multifunctional monomers are preferably used.

The photopolymerizable compound may be included at a content of 5 to 50 parts by weight, preferably 7 to 45 parts by weight, and more preferably 10 to 20 parts by weight, based on a total of 100 parts by weight of the solid content of the metal oxide photosensitive resin composition. When the content of the photopolymerizable compound satisfies this content range, it is desirable because intensity or leveling characteristics of a pixel unit tend to be improved.

When the photopolymerizable compound is included at an amount less than this content range, the intensity of the pixel unit may be somewhat reduced. On the other hand, when the photopolymerizable compound is included at an amount greater than this content range, the leveling characteristics may be somewhat degraded. Therefore, it is desirable that the photopolymerizable compound is included within this content range.

Photopolymerization Initiator

The metal oxide photosensitive resin composition for forming a blue pattern layer according to the present invention may include a photopolymerization initiator. The photopolymerization initiator preferably includes an acetophenone-based compound. For example, the acetophenone-based compound may include oligomers of diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexyl phenyl ketone, 2-methyl-1-(4-methylthiophenyl)-2-morpholinopropan-1-one, 2-benzyl-2-dimethylamino-1-(4-morpholinophenyl)butan-1-one, 2-hydroxy-2-methyl[4-(1-methylvinyl)phenyl]propan-1-one, and the like, preferably include 2-benzyl-2-dimethylamino-1-(4-morpholinophenyl)butan-1-one, and the like.

Also, photopolymerization initiators other than the acetophenone-based compound may be used in combination of two or more. The photopolymerization initiators other than the acetophenone-based compound may include a free radical generator for generating free radicals upon irradiation with light, a sensitizing agent, an acid generator, and the like.

The free radical generator may, for example, include a benzoin-based compound, a benzophenone-based compound, a thioxanthone-based compound, a triazine-based compound, and the like. The benzoin-based compound may, for example, include benzoin, benzoin methyl ether, benzoin ethyl ether, benzoin isopropyl ether, benzoisobutyl ether, and the like. The benzophenone-based compound may, for example, include benzophenone, methyl-o-benzoylbenzoate, 4-phenyl benzophenone, 4-benzoyl-4'-methyldiphenylsulfide, 3,3',4,4'-tetra(t-butylperoxycarbonyl) benzophenone, 2,4,6-trimethyl benzophenone, and the like. The thioxanthone-based compound may, for example, include 2-isopropylthioxanthone, 4-isopropylthioxanthone, 2,4-diethylthioxanthone, 2,4-dichlorothioxanthone, 1-chloro-4-propoxythioxanthone, and the like. The triazine-based compound may, for example, include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl) ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, and the like.

2,4,6-Trimethylbenzoyldiphenylphosphine oxide, 2,2,-bis(o-chlorophenyl)-4,4',5,5'-tetraphenyl-1,2'-biimidazole, 10-butyl-2-chloroacridone, 2-ethylanthraquinone, benzyl, 9,10-phenanthrenequinone, camphorquinone, methyl phenyl glyoxylate, titanocene compounds, and the like may, for example, be used as the free radical generator. The acid generator may, for example, include onium salts such as 4-hydroxyphenyl dimethyl sulfonium p-toluenesulfonate, 4-hydroxyphenyl dimethyl sulfonium hexafluoroantimonate, 4-acetoxyphenyl dimethyl sulfonium p-toluenesulfonate, 4-acetoxyphenyl methyl benzylsulfonium hexafluoroantimonate, triphenylsulfonium p-toluenesulfonate, triphenylsulfonium hexafluoroantimonate, diphenyliodonium p-toluenesulfonate, diphenyliodonium hexafluoroantimonate, and the like, or nitrobenzyl tosylates, benzoin tosylates, and the like.

Among the compounds, compounds for generating acids together with the free radicals may also be used as the free radical generator. For example, a triazine-based photopolymerization initiator may also be used as the acid generator.

The photopolymerization initiator is typically present at a weight fraction of 0.1 to 40 parts by weight, preferably 1 to 30 parts by weight, and more preferably 10 to 25 parts by weight, based on the sum of the solid weights of the binder resin and the photopolymerizable compound.

When the content of the photopolymerization initiator falls within this content range, it is desirable because the metal oxide photosensitive resin composition may be highly sensitized, resulting in good intensity of a pixel unit formed using the composition or improved leveling characteristics at a surface of the pixel unit.

In addition, a photopolymerization initiator aid may be used in the present invention. The photopolymerization initiator aid may be often used in combination with the photopolymerization initiator, and thus is a compound used to promote polymerization of a photopolymerizable compound whose polymerization is initiated by the photopolymerization initiator. The photopolymerization initiator aid may include an amine-based compound, an alkoxy anthracene-based compound, a thioxanthone-based compound, and the like.

The amine-based compound may, for example, include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethyl para-toluidine, 4,4'-bis(dimethylamino)benzophenone (generally referred to as Michler's ketone), 4,4'-bis(diethylamino)benzophenone, 4,4'-bis(ethylmethylamino)benzophenone, and the like. Among these, 4,4'-bis(diethylamino)benzophenone is preferred. The alkoxy anthracene-based compound may, for example, include 9,10-dimethoxyanthracene, 2-ethyl-9,10-dimethoxyanthracene, 9,10-diethoxyanthracene, 2-ethyl-9,10-diethoxyanthracene, and the like. The thioxanthone-based compound may, for example, include 2-isopropylthioxanthone, 4-isopropylthioxanthone, 2,4-diethylthioxanthone, 2,4-dichlorothioxanthone, 1-chloro-4-propoxythioxanthone, and the like.

Such photopolymerization initiator aids may be used alone or in combination of a plurality thereof. Also, a commercially available photopolymerization initiator aid may be used as the photopolymerization initiator aid. For example, the commercially available photopolymerization initiator aid may include the product name "EAB-F" (manufactured by Hodogaya Chemical Co., Ltd.), and the like.

When the photopolymerization initiator aid is used, the photopolymerization initiator aid may be typically used at an amount of 10 moles or less, preferably an amount of 0.01 to 5 moles per one mole of the photopolymerization initiator. When the photopolymerization initiator aid is included within this molar range, it is desirable because sensitivity of the metal oxide photosensitive resin composition may be further enhanced, and productivity of the color filter formed using the metal oxide photosensitive resin composition may be improved.

Solvent

Solvents that may be included in the metal oxide photosensitive resin composition for forming a blue pattern layer according to the present invention are not particularly limited. For example, various organic solvents typically used in the field of the photosensitive resin composition may be used.

For example, the solvent may include ethylene glycol monoalkyl ethers such as ethylene glycol monomethyl ether, ethylene glycol monoethyl ether, ethylene glycol monopropyl ether, ethylene glycol monobutyl ether, and the like, diethylene glycol dialkyl ethers such as diethylene glycol dimethyl ether, diethylene glycol diethyl ether, diethylene glycol dipropyl ether, diethylene glycol dibutyl ether, and the like, ethylene glycol alkyl ether acetates such as methyl cellosolve acetate, ethyl cello solve acetate, and the like, alkylene glycol alkyl ether acetates such as propylene glycol monomethyl ether acetate, propylene glycol monoethyl ether acetate, propylene glycol monopropyl ether acetate, methoxybutyl acetate, methoxypentyl acetate, and the like, aromatic hydrocarbons such as benzene, toluene, xylene, mesitylene, and the like, ketones such as methyl ethyl ketone, acetone, methyl amyl ketone, methyl isobutyl ketone, cyclohexanone, and the like, alcohols such as ethanol, propanol, butanol, hexanol, cyclohexanol, ethylene glycol, glycerin, and the like, esters such as ethyl 3-ethoxypropionate, methyl 3-ethoxypropionate, and the like, cyclic ethers such as γ-butyrolactone, and the like.

Among the aforementioned solvents, the solvent may preferably include organic solvents having a boiling point of 100° C. to 250° C., more preferably include alkylene glycol alkyl ether acetates, ketones, and esters such as ethyl 3-ethoxypropionate or methyl 3-ethoxypropionate, and further preferably include propylene glycol monomethyl ether acetate, propylene glycol monoethyl ether acetate, cyclohexanone, ethyl 3-ethoxypropionate, methyl 3-methoxypropionate, and the like in term of coatability and dryness. Such solvents may be used alone or in combination of two or more, but the present invention is not limited thereto.

According to another exemplary embodiment of the present invention, the solvent may include (A) a solvent having a boiling point of 100 to 169° C. and (B) a solvent having a boiling point of 170 to 250° C.

When the metal oxide photosensitive resin composition according to the present invention includes the solvent (A) having a boiling point of 100 to 169° C. and the solvent (B) having a boiling point of 170 to 250° C., VD stains and pin stains (pin mura) do not occur due to excellent flow characteristics. Therefore, the metal oxide photosensitive resin composition has an advantage in that a color filter whose photoluminescence intensity is not changed and interior display quality is improved may be provided.

The solvent (A) having a boiling point of 100 to 169° C. may include one or more selected from the group consisting of ethers, aromatic hydrocarbons, ketones, alcohols, esters, and amides. Specifically, the solvent (A) may include one or more selected from the group consisting of propylene glycol monomethyl ether acetate, ethylene glycol monomethyl ether (approximately 124 to 125° C.), ethylene glycol monoethyl ether (approximately 135.6° C.), methyl cellosolve acetate (approximately 145° C.), ethyl cellosolve acetate (approximately 156° C.), toluene (approximately 110.6° C.), xylene (approximately 138.4° C.), mesitylene (approximately 164.7° C.), methyl amyl ketone (approximately 151° C.), methyl isobutyl ketone (approximately 116.1° C.), cyclohexanone (approximately 155.6° C.), butanol (approximately 117.7° C.), hexanol (approximately 157° C.), cyclohexanol (approximately 161.8° C.), and ethyl 3-ethoxypropionate (approximately 166° C.).

The solvent (B) having a boiling point of 170 to 250° C. may include one or more selected from the group consisting of ethers, aromatic hydrocarbons, ketones, alcohols, esters, and amides. Specifically, the solvent (B) may include one or more selected from the group consisting of 1,3-butylene glycol diacetate, ethyl-3-ethoxypropionate, propylene glycol diacetate, ethylene glycol monopropyl ether (approximately 150-152° C.), ethylene glycol monobutyl ether (approximately 171° C.), diethylene glycol diethyl ether (approximately 189° C.), methoxybutyl acetate (approximately 172° C.), ethylene glycol (approximately 197.3° C.), and γ-butyrolactone (approximately 204° C.).

The solvent may be included at a content of 60 to 90 parts by weight, preferably 70 to 85 parts by weight, based on a total of 100 parts by weight of the metal oxide photosensitive resin composition. When the solvent is included within this content range, it is desirable because the resin composition tends to exhibit a better coating property when applied using a coating system such as a roll coater, a spin coater, a slit & spin coater, a slit coater (often referred to as a die coater), an ink-jet printer, and the like. When the solvent is included at an amount less than this content range, a coating property may be somewhat degraded, which makes it somewhat difficult to perform a process. On the other hand, when the solvent is included at an amount greater than this content range, the performance of the color filter formed of the metal oxide photosensitive resin composition, particularly the blue pixels formed of specifically the metal oxide photosensitive resin composition, may be somewhat degraded.

Additives

The metal oxide photosensitive resin composition for forming a blue pattern layer according to the present invention may further include additives such as a filler, other polymer compounds, a pigment dispersing agent, an adhesion promoter, an antioxidant, an ultraviolet (UV) absorbent, an anti-agglomeration agent, and the like, when necessary.

Specifically, the additives according to the present invention may further include one or more selected from the group consisting of a UV absorbent, an antioxidant, and a thermal curing agent.

The UV absorbent may impart an effect of adjusting a size of a pattern and an effect of preventing yellowing caused during a high-temperature process to enhance quantum efficiency.

Generally, the UV absorbent is known to be used when micropatterns may be not formed due to an increase in CD bias of the photosensitive resin composition. In this case, the term "CD" refers to an embossed region of a pattern, and the term "CD bias" refers to an extent in which a size of the formed pattern is higher than that of a mask pattern to be realized. When the UV absorbent is added, the UV absorbent may absorb some of UV rays to reduce the CD bias caused by diffraction, thereby realizing a desired pattern.

The UV absorbent according to the present invention may include one or more selected from benzotriazole-based, triazine-based, and benzophenone-based UV absorbents.

Known compounds may be used as the benzotriazole-based UV absorbent. Specifically, octyl 3-[3-tert-butyl-4-hydroxy-5-(5-chloro-2H-benzotriazol-2-yl)phenyl]propionate, 2-ethylhexyl 3-(3-tert-butyl-4-hydroxy-5-(5-chloro-2H-benzotriazol-2-yl)phenyl)propionate, [3-[3-(2H-benzotriazol-2-yl)-5-(1,1-methylethyl)-4-hydroxyphenyl]-1-oxopropyl]-ω-[3-[3-(2H-benzotriazol-2-yl)-5-(1,1-dimethylethyl)-4-hydroxyphenyl]-1-oxopropoxy]poly(oxy-1,2-ethanediyl), (3-(3-(2H-benzotriazol-2-yl)-5-(1,1- dimethylethyl)-4-hydroxyphenyl)-1-oxopropyl)-hydroxy poly(oxo-1,2-ethanediyl), 2-(3-tert-butyl-2-hydroxy-5-methylphenyl)-5-chloro-2H-benzotriazole, 2-(2H-benzotriazol-2-yl)-4,6-di-tertpentylphenol, 3-(2H-benzotriazolyl)-5-(1,1-dimethylethyl)-4-hydroxy-benzene propionic acid octyl ester, 2-(2H-benzotriazol-2-yl)-4,6-bis(1-methyl-1-phenylethyl)phenol, 2-(2H-benzotriazol-2-yl)-6-(1-methyl-1-phenylethyl)-4-(1,1,3,3-tetramethylbutyl)phenol, and the like are preferred.

Known compounds may be used as the triazine-based UV absorbent. Specifically, the triazine-based UV absorbent may include 2-(4,6-dimethyl-1,3,5-triazin-2-yl)-5-((hexyl)oxy)-phenol, 2-(4-(2-hydroxy-3-tridecyloxypropyl)oxy)-2-hydroxyphenyl)-4,6-bis(2,4-dimethylphenyl)-1,3,5-triazine, 2-(4-(2-hydroxy-3-didecyloxypropyl)oxy)-2-hydroxyphenyl)-4,6-bis(2,4-dimethylphenyl)-1,3,5-triazine, 2-(2-hydroxy-4-(3-(2-ethylhexyl-1-oxy)-2-hydroxypropyloxy)phenyl)-4,6-bis(2,4-dimethylphenyl)-1,3,5-triazine, 2,2'-[6-(2,4-dibutoxyphenyl)-1,3,5-triazine-2,4-diyl]bis(5-butoxyphenol), 6-methylheptyl 2-{4-[4,6-di(4-biphenylyl)-1,3,5-triazin-2-yl]-3-hydroxyphenoxy}propanoate, and the like.

Known compounds may be used as the benzophenone-based UV absorbent. Specifically, the benzophenone-based UV absorbent may include 2-hydroxy-4-n-octyloxy benzophenone, 2-hydroxy-4-methoxy benzophenone, and the like.

The UV absorbent is preferably included at a content of 0.001 to 10 parts by weight, preferably 0.025 to 7 parts by weight, based on a total of 100 parts by weight of the solid content of the metal oxide photosensitive resin composition for forming a blue pattern layer. When the content of the UV absorbent falls within this content range, an effect of the absorbent may be improved, and a pattern may be easily formed without impairing an effect of the photopolymerization initiator.

Because the antioxidant used in the present invention has an excellent effect of capturing radicals generated by heat during post-baking, sufficient effects may be expected even when the antioxidant is used at a small content.

The antioxidant includes one or more selected from a phosphorus-based antioxidant, a sulfur-based antioxidant, and a phenol-based antioxidant.

During a baking process performed in a manufacturing process, yellowing may be likely caused due to the radicals generated in the photopolymerization initiator. When at least one antioxidant selected from the phosphorus-based antioxidant, the sulfur-based antioxidant and the phenol-based antioxidant is combined with the photopolymerization initiator, or when at least one antioxidant selected from the phosphorus-based antioxidant, the sulfur-based antioxidant and the phenol-based antioxidant is used, the antioxidant may inhibit yellowing caused by the photopolymerization initiator. Also, tapering and straightness characteristics may also be improved.

The antioxidant may include one or more selected from the group consisting of a phenol-based compound, a phosphorus-based compound, and a sulfur-based compound. In this case, such compounds may be used in combination as a phenol/phosphorus-based compound, a phenol/sulfur-based compound, a phosphorus/sulfur-based compound, or a phenol/phosphorus/sulfur-based compound.

Types of the phenol-based antioxidant are not particularly limited. For example, specific examples of the phenol-based antioxidant may include 3,9-bis[2-(3-(3-t-butyl-4-hydroxy-5-methylphenyl)propionyloxy)-1,1-dimethylethoxy]-2,4,8,10-tetraoxaspiro[5.5]undecane, pentaerithrityl-tetrakis[3-(3,5-di-t-butyl-4-hydroxyphenyl)propionate], 1,3,5,-trimethyl-2,4,6,-tris(3'5'-di-t-butyl-4-hydroxybenzyl)benzene, triethylene glycol-bis[3-(3-t-butyl-5-methyl-4-hydroxyphenyl)propionate], 4,4'-thiobis(6-t-butyl-3-methylphenol), tris-(3,5-di-t-butyl-4-hydroxybenzyl)-isocyanurate, 1,3,5-tris(4-t-butyl-3-hydroxy-2,6-dimethylbenzyl)-isocyanurate, 1,6-hexanediol-bis[3-(3,5-di-t-butyl-4-hydroxyphenyl)propionate], 2,2-thio-diethylene bis[3-(3,5-di-t-butyl-4-hydroxyphenyl)propionate], N,N'-hexamethylene bis(3,5-di-t-butyl-4-hydroxy-hydrocinnamamide), 1,3,5-trimethyl-2,4,6-tris(3,5-di-t-butyl-4-hydroxybenzyl)benzene, 2,4-bis[(octylthio)methyl]-O-cresol, 1,6-hexanediol-bis-[3-(3,5-di-t-butyl-4-hydroxyphenyl)propionate], octadecyl 3-(3,5-di-tert-butyl-4-hydroxyphenol)propionate, 2,2'-methylene bis(4-methyl-6-t-butylphenol), 4,4'-butylidene-bis(3-methyl-6-t-butylphenol), 1,1,3-tris(2-methyl-4-hydroxy-5-t-butylphenyl)butane, 1,3,5-tris(4-hydroxybenzyl)benzene, tetrakis[methylene-3-(3,5'-di-t-butyl-4'-hydroxyphenylpropionate)]methane, and the like.

Among the phenol-based antioxidants, 3,9-bis[2-(3-(3-t-butyl-4-hydroxy-5-methylphenyl)propionyloxy)-1,1-dimethylethoxy]-2,4,8,10-tetraoxaspiro[5.5]undecane, 1,3,5,-trimethyl-2,4,6,-tris(3'5'-di-t-butyl-4-hydroxybenzyl) benzene, pentaerithrityl-tetrakis[3-(3,5-di-t-butyl-4-hydroxyphenyl)propionate], triethylene glycol-bis[3-(3-t-butyl-5-methyl-4-hydroxyphenyl)propionate], 4,4'-thiobis (6-t-butyl-3-methylphenol), tris-(3,5-di-t-butyl-4-hydroxybenzyl)-isocyanurate, 1,3,5-tris(4-t-butyl-3-hydroxy-2,6-dimethylbenzyl)-isocyanurate, 1,6-hexanediol-bis[3-(3,5-di-t-butyl-4-hydroxyphenyl)propionate], 2,2-thio-diethylene bis[3-(3,5-di-t-butyl-4-hydroxyphenyl)propionate], N,N'-hexamethylene bis(3,5-di-t-butyl-4-hydroxy-hydrocinnamamide), 1,3,5-trimethyl-2,4,6-tris(3,5-di-t-butyl-4-hydroxybenzyl)benzene, and 2,4-bis[(octylthio)methyl]-O-cresol are preferred in terms of heat resistance and heat discoloration resistance.

Commercially available products of the phenol-based antioxidant may include Irganox 1010 (commercially available from BASF), Sumilizer BBM-S (commercially available from Sumitomo Chemical Co., Ltd.), ADK STAB AO-80 (commercially available from ADEKA Corp.), Sumilizer GP (commercially available from Sumitomo Chemical Co., Ltd.), Irganox 1035 (commercially available from BASF), and the like.

Types of the phosphorus-based antioxidant are not particularly limited. For example, specific examples of the phosphorus-based antioxidant may include 3,9-bis(2,6-di-tert-butyl-4-methylphenoxy)-2,4,8,10-tetraoxa-3,9-diphosphaspiro[5.5]undecane, diisodecyl pentaerythritol diphosphite, bis(2,4-di-t-butylphenyl)pentaerythritol disphosphite, 2,2'-methylene bis(4,6-di-t-butyl-1-phenyloxy)(2-ethylhexyloxy)phosphorus, 6-[3-(3-t-butyl-4-hydroxy-5-methylphenyl)propoxy]-2,4,8,10-tetra-t-butyldibenz[d,f][1,3,2]dioxaphosphepine, triphenyl phosphite, diphenyl isodecyl phosphite, phenyl diisodecyl phosphite, 4,4'-butylidene-bis (3-methyl-6-t-butylphenylditridecyl)phosphite, octadecyl phosphite, tris(nonylphenyl)phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene-10-oxide, tris(2,4-di-t-butylphenyl)phosphite, cyclic neopentane tetrayl-bis(2,4-di-t-butylphenyl)phosphite, cyclic neopentane tetrayl-bis(2,6-di-t-butylphenyl)phosphite, 2,2-methylene bis(4,6-di-t-butylphenyl)octylphosphite, tris(2,4-di-t-butylphenyl) phosphite, tetrakis(2,4-di-t-butylphenyl) [1,1-biphenyl]-4,4'-diyl bisphosphonate, bis[2,4-bis(1,1-dimethylethyl)-6-methylphenyl]ethyl ester, phosphonic acid, and the like.

Among the phosphorus-based antioxidants, 2,2'-methylene bis(4,6-di-t-butyl-1-phenyloxy)(2-ethylhexyloxy)phosphorus, 3,9-bis(2,6-di-tert-butyl-4-methylphenoxy)-2,4,8,10-tetraoxa-3,9-diphosphaspiro[5.5]undecane, 6-[3-(3-t-butyl-4-hydroxy-5-methylphenyl)propoxy]-2,4,8,10-tetra-t-butyldibenz[d,f][1,3,2]dioxaphosphepine, and the like are preferred in terms of heat resistance and heat discoloration resistance.

Types of the sulfur-based antioxidant are not particularly limited. For example, specific examples of the sulfur-based antioxidant may include 2,2-bis({[3-(dodecylthio)propionyl]oxy}methyl)-1,3-propanediyl-bis[3-(dodecylthio)propionate], 2-mercaptobenzimidazole, dilauryl-3,3'-thiodipropionate, dimyristyl-3,3'-thiodipropionate, distearyl-3,3'-thiodipropionate, pentaerithrityl-tetrakis(3-laurylthiopropionate), 2-mercaptobenzimidazole, and the like.

Among the sulfur-based antioxidants, 2,2-bis({[3-(dodecylthio)propionyl]oxy}methyl)-1,3-propanediyl-bis[3-(dodecylthio)propionate], 2-mercaptobenzimidazole, and the like are preferred in terms of heat resistance and heat discoloration resistance.

The antioxidant may be included at a content of 0.1 to 30 parts by weight, preferably 0.5 to 20 parts by weight, based on a total of 100 parts by weight of the solid content of the metal oxide photosensitive resin composition for forming a blue pattern layer according to the present invention. When the content of the antioxidant satisfies this content range, it is advantageous in terms of solving a problem regarding a decline in photoluminescence intensity.

The thermal curing agent included in the present invention serves to enhance deep-section curing and mechanical strength of a coating film. The thermal curing agent of the present invention may include one or more selected from a multifunctional alicyclic epoxy resin, a silane-modified epoxy resin, and a novolac-type epoxy resin.

The multifunctional alicyclic epoxy resin is prepared by polymerizing a diene compound. According to one exemplary embodiment, the multifunctional alicyclic epoxy resin may be an alicyclic epoxy resin including a compound represented by Formula 1 or 2.

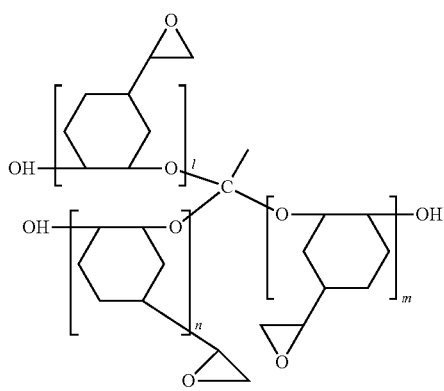

Formula 1

In Formula 1, wherein n, m and l are each independently an integer ranging from 1 to 20.

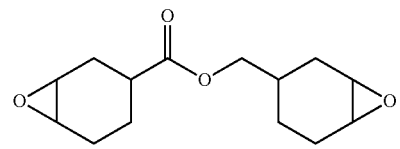

Formula 2

3,4-epoxycyclohexyl-3,4-epoxycyclohexanecarboxylate

Also, the novolac-type epoxy resin may be cresol novolac. According to one exemplary embodiment, the novolac-type epoxy resin may be an epoxy resin represented by the following Formula 3.

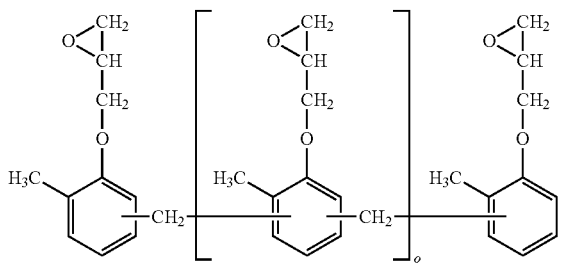

Formula 3

In Formula 3, wherein o is an integer ranging from 1 to 20.

Also, an ortho-cresol novolac-type epoxy resin (SUMI-EPOXY ESCN 195XL commercially available from Sumitomo Chemical Co., Ltd.), and an alicyclic epoxy compound (CEL-2021), a solid alicyclic epoxy resin (EHPE-3150), an epoxidized polybutadiene (PB3600), a flexible aliphatic epoxy compound (CEL-2081), a lactone-modified epoxy resin (PCL-G) (all commercially available from Daicel Chemical Industries, Ltd.), and the like are exemplified as commercially available products. In addition, "Celloxide 2000," "Epolead GT-3000," "GT-4000" (all commercially available from Daicel Chemical Industries, Ltd.), and the like are also exemplified. Among these, the novolac-type epoxy resin, ESCN-195XL, has the best curability. Among the alicyclic epoxies, "CEL-2021P" and "EHPE-3150" have the best curability. Such compounds may be used alone or in combination of two or more, and also used in combination with other types of epoxy compounds to be described below.

The silane-modified epoxy resin is a reaction product of an alkoxysilane with a hydroxyl group-containing epoxy resin. The hydroxyl group-containing epoxy resin may, for example, include a bisphenol-type epoxy resin, a novolac-type epoxy resin, a glycidyl ester-type epoxy resin, a glycidyl amine-type epoxy resin, linear aliphatic and alicyclic epoxy resins, and a biphenyl-type epoxy resin. Among these, a bisphenol-type epoxy resin and a novolac-type epoxy resin are preferably used. The bisphenol-type epoxy resin may be obtained by a reaction of a bisphenol with a haloepoxide such as epichlorohydrin or α-methyl epichlorohydrin. The bisphenol may, for example, include reaction products of phenol or 2,6-dihalophenol with aldehydes or ketones such as formaldehyde, acetaldehyde, acetone, acetophenone, cyclohexanone, benzophenone, and the like, oxidation products of dihydroxyphenyl sulfide with peracids, etherification products between hydroquinone molecules, and the like. Among such bisphenol-type epoxy resins, bisphenol-type epoxy resins obtained using bisphenol A, bisphenol S, bisphenol F, or a hydrogenated product thereof as the bisphenol are most generally used and particularly preferred. Also, the bisphenol-type epoxy resin contains a hydroxyl group that may react with an alkoxysilane to be described below. The corresponding hydroxyl group does not need to include all molecules constituting the bisphenol-type epoxy resin. In this case, the bisphenol-type epoxy resin may have a hydroxyl group as a whole. For example, a bisphenol A-type epoxy resin is represented by the following Formula 4, and, in this case, includes a bisphenol A-type epoxy resin in which q is greater than or equal to 1, and may also include a bisphenol A-type epoxy resin in which q is 0.

A more preferred epoxy equivalent is in a range of 200 to 400.

Also, alkoxysilanes used in a sol-gel method may be generally used as the alkoxysilane.

For example, a compound represented by Formula 5 or a partial condensation product thereof, and the like may be exemplified.

$$R6_pSi(OR7)_{4-p}$$ Formula 5

In Formula 5, wherein p represents an integer of 0 or 1, R6 represents an alkyl group having 1 to 6 carbon atoms, an aryl group having 1 to 6 carbon atoms, or an unsaturated aliphatic residue having 2 to 6 carbon atoms, all of which may contain a functional group directly bound to a carbon atom, and R7 represents a hydrogen atom or an alkyl group

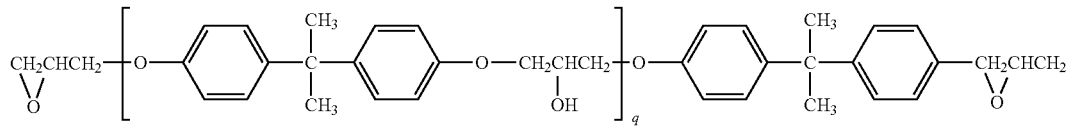

Formula 4

In Formula 4, wherein q is an integer ranging from 1 to 34.

Such a bisphenol-type epoxy resin may, for example, react with a phosphorus compound so that the bisphenol-type epoxy resin can be used as a phosphorus-modified bisphenol-type epoxy resin.

The novolac-type epoxy resin may, for example, be obtained by allowing a haloepoxide to react with a phenol novolac resin or a cresol novolac resin.

The glycidyl ester-type epoxy resin may, for example, be obtained by allowing epichlorohydrin to react with other basic acids such as phthalic acid, and the like.

The glycidyl amine-type epoxy resin may, for example, be obtained by allowing epichlorohydrin to react with polyamines such as diaminodiphenylmethane, isocyanuric acid, and the like.

The linear aliphatic epoxy resin and the alicyclic epoxy resin may, for example, be obtained by treating olefins with peracids such as peracetic acid, and the like.

The biphenyl-type epoxy resin may, for example, be obtained by allowing epichlorohydrin to react with non-phenols.

A preferred value for an epoxy equivalent of the hydroxyl group-containing epoxy resin may vary depending on a structure of the hydroxyl group-containing epoxy resin. The value may be properly selected and used according to purpose. Typically, when the hydroxyl group-containing epoxy resin component having an excessively low epoxy equivalent is used, close adhesion to a substrate may be lowered when the component is formed into a protective film. Therefore, it is desirable that the epoxy equivalent of the hydroxyl group-containing epoxy resin component is greater than or equal to 180.

Meanwhile, when the hydroxyl group-containing epoxy resin component having an excessively high epoxy equivalent is used, the component may be gelled through a reaction with an alkoxysilane to be described below. Therefore, it is desirable that the epoxy equivalent of the hydroxyl group-containing epoxy resin component is less than or equal to 5,000.

having 1 to 6 carbon atoms, provided that the plurality of R7 are the same or different from each other.

More specifically, the functional group for R6 may, for example, include a vinyl group, a mercapto group, an epoxy group, a glycidoxy group, and the like.

Also, the term "partial condensation product" refers to a product obtained by condensing some of the alkoxyl groups in the alkoxysilane represented by Formula 5. Such a partial condensation product may be obtained by hydrolyzing the alkoxysilane in the presence of an acid or an alkali and water.

Specific examples of such an alkoxysilane may include tetraalkoxysilanes such as tetramethoxysilane, tetraethoxysilane, tetrapropoxysilane, tetraisopropoxysilane, tetrabutoxysilane, and the like; trialkoxysilanes such as methyltrimethoxysilane, methyltriethoxysilane, methyltripropoxysilane, methyltributoxysilane, ethyltrimethoxysilane, ethyltriethoxysilane, n-propyltrimethoxysilane, n-propyltriethoxysilane, isopropyltrimethoxysilane, isopropyltriethoxysilane, vinyltrimethoxysilane, vinyltriethoxysilane, 3-glycidoxypropyltrimethoxysilane, 3-glycidoxypropyltriethoxysilane, 3-mercaptopropyltrimethoxysilane, 3-mercaptopropyltriethoxysilane, phenyltrimethoxysilane, phenyltriethoxysilane, 3,4-epoxycyclohexylethyltrimethoxysilane, 3,4-epoxycyclohexylethyltriethoxysilane, and the like; or partial condensation products thereof, and the like.

Among these, a partial condensation product of tetramethoxysilane or an alkyltrimethoxysilane represented by the following Formula 6 is preferred.

In Formula 6, wherein $R^1$ is a methoxy group or an alkyl group having 1 to 6 carbon atoms, and n is an integer ranging from 1 to 7.

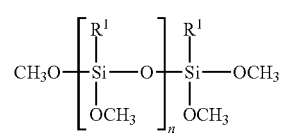

Formula 6

The partial condensation product of tetramethoxysilane or an alkyltrimethoxysilane represented by Formula 6 preferably has an average molecular weight of approximately 260 to 2,000, and more preferably an average molecular weight of approximately 260 to 890. The corresponding partial condensation product of tetramethoxysilane or an alkyltrimethoxysilane is not leaked out of the system because unreacted alkoxysilane components are evaporated together with methanol during a reaction of the partial condensation product with the hydroxyl group-containing epoxy resin component. Therefore, the partial condensation product is preferred in terms of manipulation of the reaction. Also, such a partial condensation product is preferred because the partial condensation product does not have the same toxicity as found in monomers corresponding to the partial condensation product.

In Formula 6, the number (n) of average repeating units is preferably less than or equal to 11, more preferably less than or equal to 7. When the number (n) of average repeating units is greater than 11, solubility may be degraded and the partial condensation product may be highly insoluble in the hydroxyl group-containing epoxy resin or an organic solvent, resulting in degraded reactivity with the hydroxyl group-containing epoxy resin.

The silane-modified epoxy resin is obtained by a dealcoholization condensation reaction of the hydroxyl group-containing epoxy resin with an alkoxysilane. A ratio of the alkoxysilane used for the hydroxyl group-containing epoxy resin is not particularly limited as long as the ratio of the alkoxysilane is the same as that of alkoxyl groups substantially remaining in the resulting silane-modified epoxy resin. For example, it is desirable that a ratio (mass ratio) of a silica-converted mass of the alkoxysilane/a mass of the hydroxyl group-containing epoxy resin is in a range of 0.01 to 3.

However, when the hydroxyl group-containing epoxy resin is a polymer resin having an epoxy equivalent of approximately 400 or more, an increase in viscosity or gelling of a solution may be caused as a dealcoholization reaction proceeds. Therefore, such problems may be solved, as follows.

1. An equivalent ratio is preferably adjusted to be less than 1 or greater than 1 so that one of a hydroxyl group equivalent of the hydroxyl group-containing epoxy resin and an alkoxyl group equivalent of the alkoxysilane gets higher. In particular, the equivalent ratio is preferably adjusted to be less than 0.8 or greater than or equal to 1.2. In this case, the equivalent ratio is more preferably adjusted to be greater than or equal to 1.2.

2. An increase in viscosity and gelling of a solution may be prevented by a method, for example, by stopping dealcoholization during a reaction. For example, a method of adjusting an amount of methanol removed through distillation in a reaction system, a method of cooling a reaction system to stop a reaction, or the like may be applied by converting the reaction system into a reflux system at a point of time when a viscosity of the solution has increased.

Preparation of the silane-modified epoxy resin may, for example, be carried out by adding the respective components and performing a dealcoholization condensation reaction while removing alcohols, which are generated by heating, through distillation. A reaction temperature is preferably in a range of 50 to 130° C., more preferably in a range of 70 to 110° C., and a total reaction time is preferably in a range of 1 to 15 hours. The reaction is preferably carried out under a substantially anhydrous condition to prevent a polycondensation reaction of the alkoxysilane itself. Also, the reaction may also be carried out under reduced pressure in a range that does not evaporate the hydroxyl group-containing epoxy resin in order to reduce reaction time.

Also, among catalysts known in the related art, catalysts that do not open an oxirane ring may be used in the aforementioned dealcoholization condensation reaction to promote the reaction. Such a catalyst may, for example, include metals such as lithium, sodium, potassium, rubidium, cesium, magnesium, calcium, barium, strontium, zinc, aluminum, titanium, cobalt, germanium, tin, lead, antimony, arsenic, cerium, cadmium, and manganese; oxides, salts of organic acids, halides, and alkoxides of such metals, and the like. Among these, organic tin and organic acid tin are particularly preferred. Specifically, dibutyltin dilaurate, stannous octoate, and the like are available.

In addition, the reaction may also be carried in a solvent. The solvent is not particularly limited as long as the solvent is used to dissolve the hydroxyl group-containing epoxy resin and the alkoxysilane but does not react with the hydroxyl group-containing epoxy resin and the alkoxysilane. Such an organic solvent may, for example, include aprotic polar solvents such as dimethylformamide, dimethylacetamide, tetrahydrofuran, methyl ethyl ketone, and the like.

Commercially available products preferably used as the silane-modified epoxy resin may include COMPOCERAN E-101, E-102, E-201, E-202, E-211, E-212, and the like (product name) commercially available from Arakawa Chemical Co., Ltd.

The silane-modified epoxy resin is included at a mass fraction of 0.1 to 30 parts by weight, based on a total of 100 parts by weight of the solid content of the metal oxide photosensitive resin composition for forming a blue pattern layer. When the silane-modified epoxy resin is added at an amount less than this mass fraction range, chemical resistance may be degraded. On the other hand, when the silane-modified epoxy resin is added at an excessive amount, heat resistance and development rate may be problematic.

When a post-development pixel coating film is heated (typically at 180 to 250° C., preferably 200 to 230° C. for 5 to 40 minutes, preferably 10 to 35 minutes) during a process of preparing a color filter, the thermal curing agent included in the metal oxide photosensitive resin composition for forming a blue pattern layer according to the present invention reacts with a carboxyl group in a binder resin to promote crosslinking of the binder resin, thereby improving hardness of the coating film in order to further improve performance of the color filter.

In the present invention, the thermal curing agent may be included at a content of 0.1 to 20 parts by weight, preferably 0.1 to 10 parts by weight, based on a total of 100 parts by weight of the solid content of the metal oxide photosensitive resin composition for forming a blue pattern layer. When the thermal curing agent is included within this content range, chemical resistance may be improved, and heat resistance and development rate are not problematic.

Specific examples of the filler exemplified herein may include glass, silica, alumina, and the like.

Specifically, the other polymer compounds may include curable resins such as an epoxy resin, a maleimide resin, and the like, thermoplastic resins such as polyvinylalcohol, polyacrylic acid, polyethylene glycol monoalkyl ether, polyfluoroalkyl acrylates, polyester, polyurethane, and the like.

A commercially available surfactant may be used as the pigment dispersing agent. For example, the surfactant may include silicon-based, fluorine-based, ester-based, cationic, anionic, non-ionic, bipolar surfactants, and like. Such surfactants may be used alone or in combination of two or more.

The surfactant may, for example, include polyoxyethylene alkyl ethers, polyoxyethylene alkyl phenyl ethers, polyethylene glycol diesters, sorbitan fatty acid esters, fatty acid-modified polyesters, tertiary amine-modified polyurethanes, polyethylene imines, and the like. In addition to the aforementioned surfactants, the surfactant may include product names KP (manufactured by Shin-Etsu Chemical Co., Ltd.), POLYFLOW (manufactured by Kyoeisha Chemical Co., Ltd.), EFTOP (manufactured by Tochem Products Co., Ltd.), MEGAFACE (manufactured by Dainippon Ink & Chemical Industry Co.), Fluorad (manufactured by Sumitomo 3M Ltd.), Asahi guard, Surflon (manufactured by Asahi Glass Co., Ltd.), SOLSPERSE (manufactured by Zeneca Ltd.), EFKA (manufactured by EFKA Chemicals B.V.), PB 821 (manufactured by Ajinomoto Co., Inc.), and the like.

The adhesion promoter may, for example, include vinyltrimethoxysilane, vinyltriethoxysilane, vinyltris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropyl methyl dimethoxysilane, 2-(3,4-epoxycyclohexyl)ethyl trimethoxysilane, 3-chloropropyl methyl dimethoxysilane, 3-chloropropyl trimethoxysilane, 3-methacryloxypropyl trimethoxysilane, 3-mercaptopropyl trimethoxysilane, and the like. Specific examples of the antioxidant may include 2,2'-thiobis(4-methyl-6-t-butylphenol), 2,6-di-t-butyl-4-methylphenol, and the like.

Specific examples of the anti-agglomeration agent may include sodium polyacrylate, and the like.

Among the additives, additives whose contents are not provided herein may be properly added and used by a person having ordinary skill in the art without hindering the effects of the present invention. For example, the additives may be used at a content of 0.05 to 10 parts by weight, preferably 0.1 to 10 parts by weight, and more preferably 0.1 to 5 parts by weight, based on a total of 100 parts by weight of the metal oxide photosensitive resin composition, but the present invention is not limited thereto.

The metal oxide photosensitive resin composition according to the present invention may, for example, be prepared using the following method. Scattering particles are mixed with a solvent in advance so that the scattering particles are dispersed using a bead mill, and the like until an average particle diameter of the scattering particles becomes 30 to 300 nm. In this case, a dispersing agent may be additionally used, and all or some of the binder resin may be blended, when necessary. The remainder of the binder resin, a photopolymerizable compound, a photopolymerization initiator, and optionally the other components used are added to the resulting dispersion (hereinafter often referred to as a 'mill base'), and optionally an additional solvent may be added thereto at a predetermined concentration to obtain a desired metal oxide photosensitive resin composition.

Color Filter and Image Display Device

Another aspect of the present invention relates to a color filter which includes a blue pattern layer including a cured product of the aforementioned metal oxide photosensitive resin composition for forming a blue pattern layer.

The color filter according to the present invention has advantages in that manufacturing costs may be reduced, and the color filter has a high viewing angle because the color filter is prepared using the aforementioned metal oxide photosensitive resin composition for forming a blue pattern layer instead of blue quantum dots.

The color filter includes a substrate and a blue pattern layer formed on the substrate.

The substrate may be a substrate of the color filter itself, or may also be a region on which the color filter is disposed in a display device, and the like, but the present invention is not particularly limited thereto. The substrate may be glass, silicon (Si), a silicon oxide ($SiO_x$), or a polymer substrate. Here, the polymer substrate may be a polyethersulfone (PES) or polycarbonate (PC) substrate.

The blue pattern layer may be a layer that includes the metal oxide photosensitive resin composition of the present invention, that is, a layer formed by applying the metal oxide photosensitive resin composition for forming a blue pattern layer, exposing the resin composition to light so as to have a predetermined pattern, and developing and thermally curing the resin composition. The pattern layer may be formed by performing methods generally known in the related art.

According to another exemplary embodiment of the present invention, the color filter may further include one or more selected from the group consisting of a red pattern layer and a green pattern layer.

According to still another exemplary embodiment of the present invention, the red or green pattern layer may include quantum dots and scattering particles. Specifically, the color filter according to the present invention may include a red pattern layer including red quantum dots, or a green pattern layer including green quantum dots, and the red or green pattern layer may include scattering particles. The red and green pattern layers may emit red light and blue light, respectively, by means of a light source emitting blue light to be described below.

According to yet another exemplary embodiment of the present invention, the scattering particles may include a metal oxide having an average particle diameter of 30 to 300 nm. In this case, the details of the scattering particles and the metal oxide included in the metal oxide photosensitive resin composition according to the present invention are equally applied to the details of the scattering particles and the metal oxide.

In the present invention, the shape, configuration and content of the quantum dots included in the red or green pattern layer are not limited. For example, quantum dots generally used in the related art may be used herein.

The color filter including the substrate and the pattern layer as described above may further include a barrier formed between the individual patterns, and may also further include a black matrix, but the present invention is not limited thereto.

Still another aspect of the present invention relates to an image display device including the aforementioned color filter; and a light source emitting blue light. In brief, the image display device according to the present invention includes a color filter, which includes a blue pattern layer including a cured product of the aforementioned metal oxide photosensitive resin composition, and a light source emitting blue light.

The color filter of the present invention is applicable to not only conventional liquid crystal display devices but also various image display devices such as electroluminescent display devices, plasma display devices, field emission-type display devices, and the like.

When the image display device includes the color filter including the blue pattern layer according to the present invention, and the light source, the image display device has an advantage in that the image display device has excellent photoluminescence intensity or a high viewing angle. Also, the blue pattern layer included in the color filter according to the present invention has an advantage in that an image display device having low manufacturing costs may be prepared because the blue pattern layer does not include blue quantum dots.

Hereinafter, the present invention will be described in detail with reference to exemplary embodiments thereof in order to describe the present invention more fully. However, it is apparent to those skilled in the art that various changes and modifications can be made to the exemplary embodiments of the present invention. Therefore, it should be understood that the description proposed herein is not intended to limit or define the scope of the invention. Accordingly, it will be apparent to those skilled in the art that the exemplary embodiments of the present invention are provided to describe the present invention more fully. Hereinafter, all "percentage(s)" and "part(s)" representing the content are by weight unless otherwise particularly specified.

Synthesis Example: Synthesis of Binder Resin

A flask equipped with a stirrer, a thermometer, a reflux condenser, a dropping funnel, and a nitrogen inlet pipe was prepared. Meanwhile, 74.8 g (0.20 moles) of benzylmaleimide, 43.2 g (0.30 moles) of acrylic acid, 118.0 g (0.50 moles) of vinyltoluene, 4 g of t-butylperoxy-2-ethyl hexanoate, and 40 g of propylene glycol monomethyl ether acetate (PGMEA) were added thereto, and mixed while stirring to prepare a mixture for a monomer dropping funnel. Thereafter, 6 g of n-dodecanethiol and 24 g of PGMEA were added, and mixed while stirring to prepare a mixture for a chain transfer agent dropping funnel. Subsequently, 395 g of PGMEA was added to the flask, and an atmosphere in the flask was changed from air to nitrogen, and the flask was warmed to a temperature of 90° C. while stirring the mixture. Then, the monomer and the chain transfer agent started to be dropped from the dropping funnel. The dropping was performed for 2 hours while the temperature of the flask was maintained at 90° C. After an hour, the flask were warmed to 110° C., and maintained for 3 hours. Subsequently, a gas inlet pipe was introduced to start bubbling of an oxygen/nitrogen (5/95 (v/v)) mixed gas. Then, 28.4 g (0.10 moles; 33 mol % based on carboxyl groups of acrylic acid used in this reaction) of glycidyl methacrylate, 0.4 g of 2,2'-methylene bis(4-methyl-6-t-butylphenol), and 0.8 g of triethylamine were put into a flask, and continuously reacted at 110° C. for 8 hours to obtain a binder resin having a solid acid value of 70 mgKOH/g. The binder resin had a polystyrene-converted weight average molecular weight of 16,000 and a molecular weight distribution (Mw/Mn) of 2.3, as measured by GPC.

Equipment: HLC-8120GPC (manufactured by Tosoh Co.)
Column: TSK-GELG4000HXL+TSK-GELG2000HXL (connected in series)
Column temperature: 40° C.
Mobile-phase solvent: tetrahydrofuran
Flow rate: 1.0 mL/min.
Injection amount: 50 μL
Detector: RI
Concentration of measured sample: 0.6% by mass (solvent=tetrahydrofuran)
Standard materials for calibration: TSK STANDARD POLYSTYRENE F-40, F-4, F-1, A-2500, A-500 (manufactured by Tosoh Co.)

The ratio of the weight average molecular weight and the number average molecular weight of the sample thus obtained was set as a molecular weight distribution (Mw/Mn).

EXAMPLES

Examples 1 to 25 and Comparative Examples 1 to 5: Preparation of Metal Oxide Photosensitive Resin Compositions Photosensitive resin compositions were prepared according to compositions listed in the following Tables 1 to 4. In this case, the details of scattering particles and coloring agents used in Examples and Comparative Examples are listed in the following Tables 5 and 6.

TABLE 1

| | | Examples | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Scattering particles | E-1 | 15 | — | — | — | 5 | 10 | 30 | — | — | 0.1 | 60 | 50 |
| | E-2 | — | 15 | — | — | — | — | — | — | — | — | — | — |
| | E-3 | — | — | 15 | — | — | — | — | — | — | — | — | — |
| | E-4 | — | — | — | 15 | — | — | — | — | — | — | — | — |
| | E-5 | — | — | — | — | — | — | — | — | — | — | — | — |
| | E-6 | — | — | — | — | — | — | — | — | — | — | — | — |
| | E-7 | — | — | — | — | — | — | — | 15 | — | — | — | — |
| | E-8 | — | — | — | — | — | — | — | — | 15 | — | — | — |
| | E-9 | — | — | — | — | — | — | — | — | — | — | — | — |
| | E-10 | — | — | — | — | — | — | — | — | — | — | — | — |
| | E-11 | — | — | — | — | — | — | — | — | — | — | — | — |
| Binder resin[1] | | 6.52 | 6.52 | 6.52 | 6.52 | 6.52 | 6.52 | 6.52 | 6.52 | 6.52 | 6.52 | 6.52 | 6.52 |
| Photopolymerizable compound[2] | | 4.35 | 4.35 | 4.35 | 4.35 | 4.35 | 4.35 | 4.35 | 4.35 | 4.35 | 4.35 | 4.35 | 4.35 |
| Photopolymerization initiator[3] | | 2.29 | 2.29 | 2.29 | 2.29 | 2.29 | 2.29 | 2.29 | 2.29 | 2.29 | 2.29 | 2.29 | 2.29 |
| Solvent[4] | | 71.84 | 71.84 | 71.84 | 71.84 | 81.84 | 76.84 | 56.84 | 71.84 | 71.84 | 86.74 | 26.84 | 36.84 |

[1]Binder resin prepared in Synthesis Example
[2]Dipentaerythritol hexaacrylate (KAYARAD DPHA commercially available from Nippon Kayaku Co., Ltd.)
[3]Irgacure-907 (commercially available from BASF)
[4]Propylene glycol monomethyl ether acetate

TABLE 2

| | | Examples | | | | | | | |
|---|---|---|---|---|---|---|---|---|---|
| | | 13 | 14 | 15 | 16 | 17 | 18 | 19 | 20 |
| Scattering particles | E-1 | 15 | 15 | 15 | 15 | 15 | 15 | 15 | 15 |
| Blue coloring agent | B-1 | 3 | — | — | — | 1.5 | 1.5 | 1.5 | 1.5 |
| | B-2 | — | 3 | — | — | 1.5 | — | — | — |
| | B-3 | — | — | 3 | — | — | 1.5 | — | — |
| | B-4 | — | — | — | 3 | — | — | 1.5 | — |
| | V-1 | — | — | — | — | — | — | — | 1.5 |
| Binder resin[1] | | 9.75 | 9.75 | 9.75 | 9.75 | 9.75 | 9.75 | 9.75 | 9.75 |
| Photopolymerizable compound[2] | | 6.5 | 6.5 | 6.5 | 6.5 | 6.5 | 6.5 | 6.5 | 6.5 |
| Photopolymerization initiator[3] | | 2.29 | 2.29 | 2.29 | 2.29 | 2.29 | 2.29 | 2.29 | 2.29 |
| Solvent[4] | | 63.46 | 63.46 | 63.46 | 63.46 | 63.46 | 63.46 | 63.46 | 63.46 |

[1]Binder resin prepared in Synthesis Example
[2]Dipentaerythritol hexaacrylate (KAYARAD DPHA commercially available from Nippon Kayaku Co., Ltd.)
[3]Irgacure-907 (commercially available from BASF)
[4]Propylene glycol monomethyl ether acetate

TABLE 3

| | | Examples | | | | |
|---|---|---|---|---|---|---|
| | | 21 | 22 | 23 | 24 | 25 |
| Scattering particles | E-1 | 15 | 15 | 15 | 15 | 15 |
| Blue coloring agent | B-1 | 55 | — | — | — | — |
| | B-2 | — | 55 | — | — | — |
| | B-3 | — | — | 55 | — | — |
| | B-4 | — | — | — | 55 | — |
| | V-1 | — | — | — | — | 55 |
| Binder resin[1] | | 9.75 | 9.75 | 9.75 | 9.75 | 9.75 |
| Photopolymerizable compound[2] | | 6.5 | 6.5 | 6.5 | 6.5 | 6.5 |
| Photopolymerization initiator[3] | | 2.29 | 2.29 | 2.29 | 2.29 | 2.29 |
| Solvent[4] | | 11.46 | 11.46 | 11.46 | 11.46 | 11.46 |

[1]Binder resin prepared in Synthesis Example
[2]Dipentaerythritol hexaacrylate (KAYARAD DPHA commercially available from Nippon Kayaku Co., Ltd.)
[3]Irgacure-907 (commercially available from BASF)
[4]Propylene glycol monomethyl ether acetate

TABLE 4

| | | Comparative Example | | | | |
|---|---|---|---|---|---|---|
| | | 1 | 2 | 3 | 4 | 5 |
| Scattering particles | E-1 | — | — | — | — | — |
| | E-2 | — | — | — | — | — |
| | E-3 | — | — | — | — | — |
| | E-4 | — | — | — | — | — |
| | E-5 | — | — | 15 | — | — |
| | E-6 | — | — | — | 15 | — |
| | E-7 | — | — | — | — | — |
| | E-8 | — | — | — | — | — |
| | E-9 | — | — | — | — | 15 |
| | E-10 | 15 | — | — | — | — |
| | E-11 | — | 15 | — | — | — |
| Binder resin[1] | | 6.52 | 6.52 | 6.52 | 6.52 | 6.52 |
| Photopolymerizable compound[2] | | 4.35 | 4.35 | 4.35 | 4.35 | 4.35 |
| Photopolymerization initiator[3] | | 2.29 | 2.29 | 2.29 | 2.29 | 2.29 |
| Solvent[4] | | 71.84 | 71.84 | 71.84 | 71.84 | 71.84 |

[1]Binder resin prepared in Synthesis Example
[2]Dipentaerythritol hexaacrylate (KAYARAD DPHA commercially available from Nippon Kayaku Co., Ltd.)
[3]Irgacure-907 (commercially available from BASF)
[4]Propylene glycol monomethyl ether acetate

TABLE 5

| | Type | Average particle diameter | Product name | Manufacturer |
|---|---|---|---|---|
| E-1 | $TiO_2$ | 220 nm | TR-88 | Huntsman Corp. |
| E-2 | $TiO_2$ | 30 nm | TTO-55(C) | Ishihara Sangyo Kaisha Ltd. |
| E-3 | $TiO_2$ | 130 nm | PT-401L | Ishihara Sangyo Kaisha Ltd. |
| E-4 | $TiO_2$ | 210 nm | CR-63 | Ishihara Sangyo Kaisha Ltd. |
| E-5 | $TiO_2$ | 500 nm | R-960 | DuPont |
| E-6 | $TiO_2$ | 900 nm | R-902 | DuPont |
| E-7 | $Al_2O_3$ | 50 nm | 0.05 μm Alumina powder | Allied Chemical Co. |
| E-8 | $Al_2O_3$ | 300 nm | 0.3 μm Alumina powder | Allied Chemical Co. |
| E-9 | $Al_2O_3$ | 1000 nm | 1.0 μm Alumina powder | Allied Chemical Co. |
| E-10 | $SiO_2$ | 2000 nm | SYLYSIA 220A | Fuji Silysia Chemical Ltd. |
| E-11 | $SiO_2$ | Fumed silica | Aerosil 200 | Degussa Corp. |

TABLE 6

| Type | | Product name | Manufacturer |
|---|---|---|---|
| B-1 | C.I. Pigment B15:6 | Fastogen Blue EP-7S | DIC |
| B-2 | C.I. Pigment B15:4 | Fastogen Blue 5424 | DIC |
| B-3 | C.I. Pigment B15:3 | Heliogen Blue L 7072 D | BASF |
| B-4 | C.I. Pigment B16 | Pigment Blue 16 | CPMA |
| V-1 | C.I. Pigment V23 | Fastogen Super Violet 140 V | DIC |

Preparation of Color Filters

Color filters were prepared using the metal oxide photosensitive resin compositions prepared in Examples and Comparative Examples. That is, each of the photosensitive resin compositions was applied onto a glass substrate using a spin coating method, and the glass substrate was put on a heating plate, and then kept at a temperature of 100° C. for 3 minutes to form a thin film.

Next, a test photomask, which had a square transmission pattern having a size of 20 mm×20 mm (width×length) and a line/space pattern having a size of 1 μm to 100 μm, was placed on the thin film, and the thin film was then irradiated with UV rays at an interval of 100 μm from the test photomask.

In this case, the thin film was irradiated with UV rays at an exposure intensity of 200 mJ/cm² (365 nm) under an air atmosphere using an ultra-high pressure mercury lamp (Product Name: USH-250D commercially available from Ushio Denki Co., Ltd.) as a UV light source, and a certain optical filter was not used.

The thin film thus irradiated with UV rays was developed for 80 seconds in an aqueous KOH developing solution (pH 10.5). A glass plate coated with the thin film was washed with distilled water, dried by blowing nitrogen gas, and heated for 10 minutes in a 150° C. heating oven to prepare a color filter pattern for blue pixels. The film thickness of the color pattern thus prepared was 5.0 μm.

Experimental Example 1

Measurement of Micropatterns

In the color filters prepared using the metal oxide photosensitive resin compositions prepared in Examples 1 to 12 and Comparative Examples 1 to 5, a size of a pattern obtained through a line/space pattern mask designed to have a thickness of 100 μm was measured using an optical microscope (OM: ECLIPSE LV100POL commercially available from Nikon), and a difference between the measured value of the pattern and the designed value of the line/space pattern mask is listed in the following Table 7.

TABLE 7

|  | Difference in micropatterns |
| --- | --- |
| Example 1 | 10 |
| Example 2 | 11 |
| Example 3 | 9 |
| Example 4 | 10 |
| Example 5 | 13 |
| Example 6 | 6 |
| Example 7 | 2 |
| Example 8 | 12 |
| Example 9 | 9 |
| Example 10 | 15 |
| Example 11 | 1 |
| Example 12 | 6 |
| Comparative Example 1 | −2 |
| Comparative Example 2 | 25 |
| Comparative Example 3 | −1 |
| Comparative Example 4 | −5 |
| Comparative Example 5 | −4 |

When a difference between the designed value of the line/space pattern mask and the measured values of the obtained micropatterns is greater than or equal to 20 μm, it is difficult to realize micropixels. On the other hand, when the difference is a negative value, it refers to a critical value at which process failures are caused.

Referring to Table 7, it can be seen that the micropatterns were well formed in the case of Examples 1 to 9, compared to Comparative Examples 1 to 5 in which the average particle diameter of the scattering particles of the metal oxide was outside the range of 30 to 300 nm. However, it can be seen that it was somewhat difficult to form micropixels when the content of the scattering particles was outside the range of 5 to 30 parts by weight in the case of Examples 10 to 12.

Experimental Example 2

Measurement of Photoluminescence Intensity

In the color filters prepared using the metal oxide photosensitive resin composition prepared in Examples and Comparative Examples, a pattern portion in which square patterns with a size of 20 mm×20 mm were formed was irradiated with UV rays at 365 nm using a tubular 4W UV irradiation system (VL-4LC, VILBER LOURMAT) to measure a light-converted region. In this case, the photoluminescence intensity at a wavelength region of 450 nm was measured using a spectrum meter (commercially available from Ocean Optics Inc.). The results are listed in the following Table 8.

TABLE 8

|  | Photoluminescence intensity |
| --- | --- |
| Example 1 | 28,500 |
| Example 2 | 34,800 |
| Example 3 | 30,800 |
| Example 4 | 28,800 |
| Example 5 | 34,200 |
| Example 6 | 31,300 |
| Example 7 | 26,500 |
| Example 8 | 21,900 |
| Example 9 | 36,500 |
| Example 10 | 22,400 |
| Example 11 | 15,200 |
| Example 12 | 17,800 |
| Example 13 | 32,425 |
| Example 14 | 33,322 |
| Example 15 | 31,405 |
| Example 16 | 32,000 |
| Example 17 | 31,212 |
| Example 18 | 32,632 |
| Example 19 | 30,048 |
| Example 20 | 32,144 |
| Example 21 | 8,556 |
| Example 22 | 8,523 |
| Example 23 | 8,321 |
| Example 24 | 8,740 |
| Example 25 | 8,455 |
| Comparative Example 1 | 17,700 |
| Comparative Example 2 | 28,200 |
| Comparative Example 3 | 19,200 |
| Comparative Example 4 | 16,400 |
| Comparative Example 5 | 15,300 |

It was meant that the higher the measured photoluminescence intensity was, the higher the optical efficiency was. Referring to Table 8, it can be seen that the photoluminescence intensity was improved in the case of Examples 1 to 9, compared to Comparative Examples 1 to 5 in which the average particle diameter of the scattering particles of the metal oxide was outside the range of 30 to 300 nm. However, it can be seen that the optical efficiency was somewhat degraded when the content of the scattering particles was outside the range of 5 to 30 parts by weight in the case of Examples 10 to 12.

From the results of Examples 13 to 20, it can be seen that the photoluminescence intensity was maintained at a high level even when the blue coloring agent and the purple coloring agent were added. However, it can be seen that the photoluminescence intensity was severely degraded in the case of Examples 21 to 25 when the content of the blue coloring agent was greater than 50 parts by weight, based on the total weight of the composition.

Experimental Example 3

Measurement of Viewing Angle

In the color filters prepared using the metal oxide photosensitive resins prepared in Examples and Comparative Examples, the intensity of light according to viewing angle under light transmission conditions was measured for a pattern portion, in which square patterns with a size of 20 mm×20 mm were formed, using a goniophotometer (GC-5000L, Nippon Denshoku), and the diffusivity was calculated using the following Equation 1. The results are listed in the following Table 9.

Diffusivity (%)=(*I*70+*I*20)/2×*I*5×100    Equation 1 wherein I represents an intensity of light measured at each of viewing angles.

TABLE 9

|  | Diffusivity (%) |
|---|---|
| Example 1 | 84.3 |
| Example 2 | 20.5 |
| Example 3 | 43.5 |
| Example 4 | 78.9 |
| Example 5 | 41.2 |
| Example 6 | 78.1 |
| Example 7 | 82.1 |
| Example 8 | 18.7 |
| Example 9 | 34.5 |
| Example 10 | 2.1 |
| Example 11 | 8.5 |
| Example 12 | 11.2 |
| Example 13 | 75.4 |
| Example 14 | 77.8 |
| Example 15 | 76.1 |
| Example 16 | 78.4 |
| Example 17 | 77.3 |
| Example 18 | 76.8 |
| Example 19 | 76.9 |
| Example 20 | 77.3 |
| Example 21 | 10.5 |
| Example 22 | 8.9 |
| Example 23 | 9.9 |
| Example 24 | 10.1 |
| Example 25 | 8.1 |
| Comparative Example 1 | 4.5 |
| Comparative Example 2 | 2.5 |
| Comparative Example 3 | 8 |
| Comparative Example 4 | 3.5 |
| Comparative Example 5 | 2.3 |

It was meant that the higher the measured diffusivity was, the wider the viewing angle was. As a result, referring to Table 9, it can be seen that the viewing angle was improved in the case of Examples 1 to 9, compared to Comparative Examples 1 to 5 in which the average particle diameter of the scattering particles of the metal oxide was outside the range of 30 to 300 nm. However, it can be seen that the viewing angle was somewhat reduced when the content of the scattering particles was outside the range of 5 to 30 parts by weight in the case of Examples 10 to 12.

From the results of Examples 13 to 20, it can be seen that the improved viewing angle was maintained when the purple coloring agent was added. However, it can be seen that the viewing angle was remarkably reduced in the case of Examples 21 to 25 when the content of the blue coloring agent was greater than 50 parts by weight, based on the total weight of the composition.

Experimental Example 4

Ambient Light Reflectivity

In the color filters prepared using the metal oxide photosensitive resins for forming a blue pattern layer prepared in Examples 1 and 13 to 25, the reflectivity of light under light transmission conditions was measured for a pattern portion, in which square patterns with a size of 20 mm×20 mm were formed, using a spectrum colorimeter (Konica Minolta, Inc.). The results are listed in the following Table 10.

TABLE 10

|  | Ambient light reflectivity (%) |
|---|---|
| Example 1 | 9.1 |
| Example 13 | 3.3 |
| Example 14 | 3 |
| Example 15 | 2.5 |
| Example 16 | 2.9 |
| Example 17 | 3.5 |
| Example 18 | 2.2 |
| Example 19 | 2.6 |
| Example 20 | 2.7 |
| Example 21 | 1.1 |
| Example 22 | 1 |
| Example 23 | 0.9 |
| Example 24 | 0.8 |
| Example 25 | 1 |

Based on the results listed in Table 10, it can be seen that the metal oxide photosensitive resin composition had excellent diffusivity and low ambient light reflectivity while maintaining high photoluminescence intensity when the blue coloring agent was introduced into the metal oxide photosensitive resin composition.

What is claimed is:

1. A metal oxide photosensitive resin composition for forming a blue pattern layer of a color filter which includes a red pattern layer including red quantum dots, a green pattern layer including green quantum dots and a blue pattern layer, comprising scattering particles comprising a metal oxide having an average particle diameter of 30 to 300 nm, provided that the metal oxide photosensitive resin composition does not include blue quantum dots,
    wherein the blue pattern layer prepared by the metal oxide photosensitive resin composition for forming a blue pattern later may interact with a light source emitting blue light to act as blue pixels even when the metal oxide photosensitive resin compositions does not include blue quantum dots,
    wherein the metal oxide comprises one or more oxides selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In, and a combination thereof,
    wherein the scattering particles are included at a content of 2 to 20 parts by weight, based on a total of 100 parts by weight of the metal oxide photosensitive resin composition.

2. The metal oxide photosensitive resin composition for forming a blue pattern layer of claim 1, wherein the metal oxide comprises one or more oxides selected from the group consisting of Al2O3, SiO2, ZnO, ZrO2, BaTiO3, TiO2, Ta2O5, Ti3O5, ITO, IZO, ATO, ZnO—Al, Nb2O3, SnO, MgO, and a combination thereof.

3. The metal oxide photosensitive resin composition for forming the blue pattern layer of claim 1, further comprising a blue coloring agent.

4. The metal oxide photosensitive resin composition for forming the blue pattern layer of claim 3, wherein the blue coloring agent comprises one or more blue pigments selected from the group consisting of C.I. Pigment Blue 15:3, 15:4, 15:6, 16, 21, 28, 60, 64, 76, and a combination thereof.

5. The metal oxide photosensitive resin composition for forming the blue pattern layer of claim 3, wherein the blue coloring agent further comprises one or more selected from the group consisting of a dye and a purple pigment.

6. The metal oxide photosensitive resin composition for forming the blue pattern layer of claim 3, wherein the blue coloring agent is included at a content of 0.1 to 50 parts by weight, based on a total of 100 parts by weight of the metal oxide photosensitive resin composition.

7. The metal oxide photosensitive resin composition for forming the blue pattern layer of claim 1, further comprising one or more selected from the group consisting of a binder resin; a photopolymerizable compound; a photopolymerization initiator; a solvent; and one or more additives selected from the group consisting of an ultraviolet (UV) absorbent, an antioxidant, and a thermal curing agent.

8. The metal oxide photosensitive resin composition for forming the blue pattern layer of claim 7, wherein the thermal curing agent comprises one or more selected from the group consisting of a multifunctional alicyclic epoxy resin, a silane-modified epoxy resin, and a novolac-type epoxy resin.

9. The metal oxide photosensitive resin composition for forming the blue pattern layer of claim 7, wherein the solvent comprises (A) a solvent having a boiling point of 100 to 169° C. and (B) a solvent having a boiling point of 170 to 250° C.

10. A color filter comprising the blue pattern layer comprising a cured product of the metal oxide photosensitive resin composition for forming the blue pattern layer defined in claim 1.

11. The color filter of claim 10, wherein the color filter further comprises one or more selected from the group consisting of a red pattern layer and a green pattern layer.

12. The color filter of claim 11, wherein the red or green pattern layer comprises quantum dots and scattering particles.

13. The color filter of claim 12, wherein the scattering particles comprise a metal oxide having an average particle diameter of 30 to 300 nm.

14. An image display device comprising:
the color filter defined in claim 10; and
a light source emitting blue light.

* * * * *